US012751159B2

(12) United States Patent
Choi

(10) Patent No.: US 12,751,159 B2
(45) Date of Patent: Sep. 29, 2026

(54) DISPLAY APPARATUS HAVING TRENCHES AND DISPLAYING ELEMENTS OVERLAPPING PIXEL CIRCUITS

(71) Applicant: SAMSUNG DISPLAY CO., LTD., Yongin-si (KR)

(72) Inventor: Jonghyun Choi, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 477 days.

(21) Appl. No.: 18/224,792

(22) Filed: Jul. 21, 2023

(65) Prior Publication Data

US 2024/0155891 A1 May 9, 2024

(30) Foreign Application Priority Data

Nov. 7, 2022 (KR) ........................ 10-2022-0147372

(51) Int. Cl.
*H10K 59/131* (2023.01)
*G09G 3/3233* (2016.01)
*H10K 59/124* (2023.01)

(52) U.S. Cl.
CPC ......... *H10K 59/131* (2023.02); *G09G 3/3233* (2013.01); *H10K 59/124* (2023.02); *G09G 2300/0819* (2013.01); *G09G 2300/0842* (2013.01); *G09G 2300/0861* (2013.01)

(58) Field of Classification Search
CPC ... G09G 2300/0426; G09G 2300/0814; G09G 2300/0819; G09G 2300/0842; G09G 2300/0861; G09G 2300/0866; G09G 2320/045; G09G 3/3233; G09G 3/3266; G09G 3/006; H10K 59/124; H10K 59/131;

(Continued)

(56) References Cited

U.S. PATENT DOCUMENTS 11,355,570 B2 6/2022 Park et al.
2011/0043541 A1* 2/2011 Cok ........................ G09G 3/006 445/3
2019/0164998 A1* 5/2019 Cho ..................... H10D 86/423

(Continued)

FOREIGN PATENT DOCUMENTS

KR 1020210008977 A 1/2021
KR 20210084733 A 7/2021

(Continued)

*Primary Examiner* — Richard J Hong
(74) *Attorney, Agent, or Firm* — CANTOR COLBURN LLP

(57) ABSTRACT

A display apparatus includes a substrate in which a first display area, a second display area located on an outer side of the first display area, a third display area located on an outer side of the second display area, and a non-display area are defined, first pixel circuits located in the first display area and arranged in a first direction, second pixel circuits and third pixel circuits which are located in the second display area and arranged in the first direction, driver circuits located in the third display area and arranged in the first direction, an inorganic insulating layer provided with trenches defined along a boundary between two adjacent driver circuits among the driver circuits, and an organic insulating layer disposed on the inorganic insulating layer, where at least a portion of the organic insulating layer is filled in the trenches.

20 Claims, 8 Drawing Sheets

(58) Field of Classification Search
CPC ............. H10K 59/1213; H10K 59/352; H10K 77/111; H01L 25/167
See application file for complete search history.

(56) References Cited

U.S. PATENT DOCUMENTS

| | | | | |
|---|---|---|---|---|
| 2019/0278145 | A1 | 9/2019 | Tanaka et al. | |
| 2020/0013970 | A1* | 1/2020 | Wang | H10K 77/111 |
| 2021/0202633 | A1 | 7/2021 | Song et al. | |
| 2021/0202638 | A1* | 7/2021 | Park | H10K 59/1213 |
| 2021/0217353 | A1* | 7/2021 | Zhao | H01L 25/167 |
| 2022/0085132 | A1 | 3/2022 | Kim et al. | |
| 2022/0093038 | A1* | 3/2022 | Yang | G09G 3/04 |
| 2022/0309974 | A1 | 9/2022 | Park et al. | |
| 2022/0328590 | A1 | 10/2022 | Kim et al. | |
| 2023/0053413 | A1* | 2/2023 | Liu | H10K 59/352 |
| 2023/0128710 | A1* | 4/2023 | Choi | H10K 59/124 257/40 |
| 2023/0354656 | A1* | 11/2023 | Long | H10K 59/131 |

FOREIGN PATENT DOCUMENTS

| | | | |
|---|---|---|---|
| KR | 1020210086316 | A | 7/2021 |
| KR | 1020220034952 | | 3/2022 |
| KR | 20220140928 | A | 10/2022 |

* cited by examiner

DISPLAY APPARATUS HAVING TRENCHES AND DISPLAYING ELEMENTS OVERLAPPING PIXEL CIRCUITS

This application claims priority to Korean Patent Application No. 10-2022-0147372, filed on Nov. 7, 2022, and all the benefits accruing therefrom under 35 U.S.C. § 119, the content of which in its entirety is herein incorporated by reference.

BACKGROUND

1. Field

One or more embodiments relate to a structure of a display apparatus.

2. Description of the Related Art

Recently, display apparatuses have been widely used. Also, because the thickness and weight of the display apparatuses have decreased, the use of the display apparatuses has widened.

As the display apparatuses have been utilized in various ways, there may be diverse methods for designing shapes of the display apparatuses. An increase in the occupied areas of display areas in display apparatuses results in the addition of functions embedded onto or linked with the display apparatuses.

SUMMARY

One or more embodiments provide a display apparatus that includes a non-display area with a reduced area and is robust and flexible to external impact.

According to one or more embodiments, a display apparatus includes a substrate in which a first display area, a second display area located on an outer side of the first display area, a third display area located on an outer side of the second display area, and a non-display area are defined, a plurality of first pixel circuits located in the first display area and arranged in a first direction, a plurality of second pixel circuits and a plurality of third pixel circuits which are located in the second display area and arranged in the first direction, a plurality of driver circuits located in the third display area and arranged in the first direction, an inorganic insulating layer provided with a plurality of trenches defined along a boundary between two adjacent driver circuits among the plurality of driver circuits, and an organic insulating layer disposed on the inorganic insulating layer, where at least a portion of the organic insulating layer is filled in the plurality of trenches.

In an embodiment, the display apparatus may further include a plurality of first display elements located in the first display area and electrically connected to the plurality of first pixel circuits, a plurality of second display elements located in the second display area and electrically connected to the plurality of second pixel circuits, and a plurality of third display elements located in the third display area and electrically connected to the plurality of third pixel circuits, wherein the plurality of first display elements, the plurality of second display elements, and the plurality of third display elements may each include a first electrode, an emission layer, and a second electrode.

In an embodiment, the inorganic insulating layer may be further provided with a plurality of trenches defined along a boundary between two adjacent pixel circuits among the plurality of first pixel circuits, the plurality of second pixel circuits, and the plurality of third pixel circuits.

In an embodiment, the display apparatus may further include a plurality of first connection lines connecting the plurality of first display elements to the plurality of first pixel circuits, a plurality of second connection lines connecting the plurality of second display elements to the plurality of second pixel circuits, and a plurality of third connection lines connecting the plurality of third display elements to the plurality of third pixel circuits.

In an embodiment, a length of each of the plurality of second connection lines and a length of each of the plurality of third connection lines may be greater than or equal to a length of each of the plurality of first connection lines.

In an embodiment, the plurality of first connection lines, the plurality of second connection lines, and the plurality of third connection lines may each include a material different from a material in the first electrode.

In an embodiment, a first display element distance between two adjacent first display elements, which are adjacent to each other in the first direction, in the first display area, a second display element distance between two adjacent second display elements, which are adjacent to each other in the first direction, in the second display area, and a third display element distance between two adjacent third display elements, which are adjacent to each other in the first direction, in the third display area may be substantially the same as each other.

In an embodiment, a first trench distance between two adjacent trenches, which are adjacent to each other in the first direction, in the first display area may be greater than a second trench distance between two adjacent trenches, which are adjacent to each other in the first direction, in the second display area and a third trench distance between two adjacent trenches, which are adjacent to each other in the first direction, in the third display area.

In an embodiment, the plurality of first pixel circuits, the plurality of second pixel circuits, the plurality of third pixel circuits, and the plurality of driver circuits, which are arranged adjacent to each other, may share signal lines, and the plurality of trenches may expose a portion of the signal lines, and the organic insulating layer may contact the portion of the signal lines.

In an embodiment, a signal line disposed under the plurality of trenches may extend continuously across the plurality of trenches.

In an embodiment, the plurality of driver circuits may include a plurality of first driver circuits and a plurality of second driver circuits, the plurality of first driver circuits may be scan driver circuits, and the plurality of second driver circuits may be an emission driver circuits.

In an embodiment, the plurality of first driver circuits and the plurality of second driver circuits may be arranged adjacent to each other in the first direction, and the plurality of second driver circuits may be arranged more outwardly than the plurality of first driver circuits, and the plurality of first driver circuits and the plurality of second driver circuits may be respectively arranged in a second direction crossing the first direction.

In an embodiment, the plurality of first driver circuits and the plurality of second driver circuits may be separately arranged in the first direction, the plurality of first driver circuits and the plurality of second driver circuits may be respectively arranged in a second direction crossing the first direction, and a portion of the plurality of first pixel circuits, a portion of the plurality of second pixel circuits, and a portion of the plurality of third pixel circuits may be arranged between the plurality of first driver circuits and the plurality of second driver circuits.

In an embodiment, the display apparatus may further include a shielding layer arranged between the plurality of driver circuits and the plurality of third display elements.

According to one or more embodiments, a display apparatus includes a substrate in which a display area and a non-display area surrounding the display area are defined, a plurality of pixel circuits arranged in the display area, a plurality of first driver circuits and a plurality of second driver circuits arranged in the display area, a plurality of display elements arranged in the display area and overlapping at least one selected from the plurality of pixel circuits, the plurality of first driver circuits, and the plurality of second driver circuits, a first insulating layer provided with a plurality of grooves defined along a boundary between the plurality of pixel circuits, the plurality of first driver circuits, and the plurality of second driver circuits, and a plurality of organic insulating layers disposed on the first insulating layer, where at least one selected from the plurality of organic insulating layers is disposed in the plurality of grooves and the plurality of organic insulating layers includes a material different from a material in the first insulating layer.

In an embodiment, the display area may include a first display area, a second display area, and a third display area, the plurality of pixel circuits may include a plurality of first pixel circuits arranged in the first display area, a plurality of second pixel circuits arranged in the second display area, and a plurality of third pixel circuits arranged in the second display area, the plurality of first driver circuits and the plurality of second driver circuits may be arranged in the third display area, and a plurality of display elements overlapping at least one selected from the plurality of first driver circuits and the plurality of second driver circuits are electrically connected to the plurality of third pixel circuits.

In an embodiment, the display apparatus may farther include a plurality of connection lines for electrically connecting the plurality of pixel circuits, the plurality of first driver circuits, the plurality of second driver circuits, and the plurality of display elements, wherein each of the plurality of display elements may include a first electrode, an emission layer, and a second electrode, and the plurality of connection lines may include a material different from a material in the first electrode.

In an embodiment, a planar area of a first pixel circuit area, which is an area occupied by each of the plurality of first pixel circuits, may be greater than a planar area of a second pixel circuit area, which is an area occupied by each of the plurality of second pixel circuits, and a planar area of a third pixel circuit area, which is an area occupied by each of the plurality of third pixel circuits.

In an embodiment, the plurality of display elements may be evenly arranged in the first display area, the second display area, and the third display area.

In an embodiment, the plurality of first driver circuits may be scan driver circuits, the plurality of second driver circuits may be emission driver circuits, and the plurality of second driver circuits may be arranged more outwardly than the plurality of first driver circuits.

BRIEF DESCRIPTION OF THE DRAWINGS

The above and other features of certain embodiments of the disclosure will be more apparent from the following description taken in conjunction with the accompanying drawings, in which.

DETAILED DESCRIPTION

Figure 1:
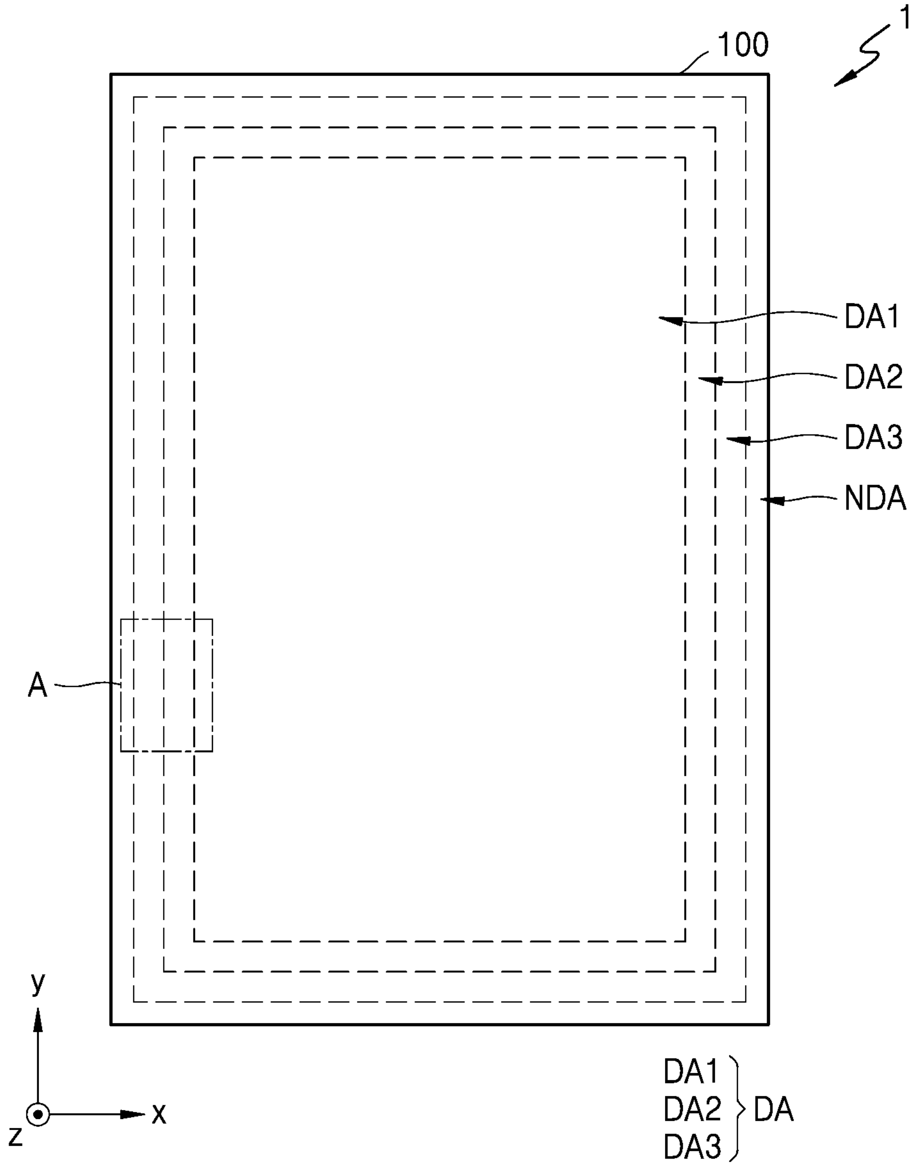
FIG. 1 is a schematic plan view of a display apparatus according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

As the disclosure allows for various changes and numerous embodiments, particular embodiments will be shown in the drawings and described in detail in the written description. The attached drawings for illustrating various embodiments of the disclosure are referred to in order to gain a sufficient understanding of the disclosure, the merits thereof, and the objectives accomplished by the implementation of the disclosure. The disclosure may, however, be embodied in many different forms and should not be construed as being limited to the embodiments set forth herein.

One or more embodiments of the disclosure will be described more fully with reference to the accompanying drawings, like reference numerals in the drawings denote like elements, and repeated descriptions thereof will not be provided.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. Throughout the disclosure, the expression "at least one of a, b, or c" or ""at least one selected from a, b and c" indicates only a, only b, only c, both a and b, both a and c, both b and c, all of a, b, and c, or variations thereof.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "on" another element, it can be directly on the other element or intervening elements may be present therebetween. In contrast, when an element is referred to as being "directly on" another element, there are no intervening elements present.

Sizes of elements in the drawings may be exaggerated for convenience of explanation. In other words, since sizes and thicknesses of elements in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being connected to another layer, region, or component, it can be directly or indirectly connected to the other layer, region, or component. For example, when a layer, region, or component is referred to as being electrically connected to another layer, region, or component, it can be directly or indirectly electrically connected to the other layer, region, or component.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

FIG. 1 is a schematic plan view of a display apparatus according to an embodiment.

A display apparatus 1 may display a moving image or a still image and may be used as a display screen of various products, for example, a portable electronic apparatus, such as a mobile phone, a smartphone, a tablet personal computer (PC), a mobile communication terminal, a personal digital assistant, an e-book terminal, a portable multimedia player (PMP), a navigation device, or an ultra mobile PC (UMPC), a television (TV), a laptop computer, a monitor, a billboard, an Internet of Things (IoT) device, and the like. Also, the display apparatus 1 may be used in a wearable device, such as a smartwatch, a watch phone, an eyewear display, or a head-mounted display (HMD). Also, the display apparatus 1 may be used as a display screen in an instrument cluster of a vehicle, a center information display (CID) mounted on a center fascia or a dashboard of a vehicle, a room mirror display replacing a side-view mirror of a vehicle, or a car headrest monitor provided for rear-seat entertainment.

In an embodiment, the display apparatus 1 may be planar overall, bent, or curved. In an embodiment, the display apparatus 1 may be bent so that display surfaces may face each other. In an alternative embodiment, the display apparatus 1 may be bent to make the display surface face outwards. Here, the term "display surface" may be a surface on which images are displayed, the display surface may include a display area DA and a non-display area NDA, and images may be provided to a user through the display area DA. Here, the term "bent" may indicate that a shape is not fixed and may be changed from its original shape to another one, and may include that a display surface is folded along one or more lines, that is, a folding axis, curved, or rolled like a scroll.

Referring to FIG. 1, an embodiment of the display apparatus 1 may include a first display area DA1, a second display area DA2, a third display area DA3, and a non-display area NDA. The description that the display apparatus 1 includes the first display area DA1, the second display area DA2, the third display area DA3, and the non-display area NDA may be understood that a substrate (100, see FIG. 2) of the display apparatus 1 includes the first display area DA1, the second display area DA2, the third display area DA3, and the non-display area NDA. The display area DA may be an area where a plurality of pixels are arranged and images are displayed. The non-display area NDA may be an area which surrounds the display area DA and where no pixels are arranged in a plan view. In an embodiment, the second display area DA2 may be located on the outer side of the first display area DA1, the third display area DA3 may be located on the outer side of the second display area DA2, and the non-display area NDA may be located on the outer side of the third display area DA3.

Figure 2:
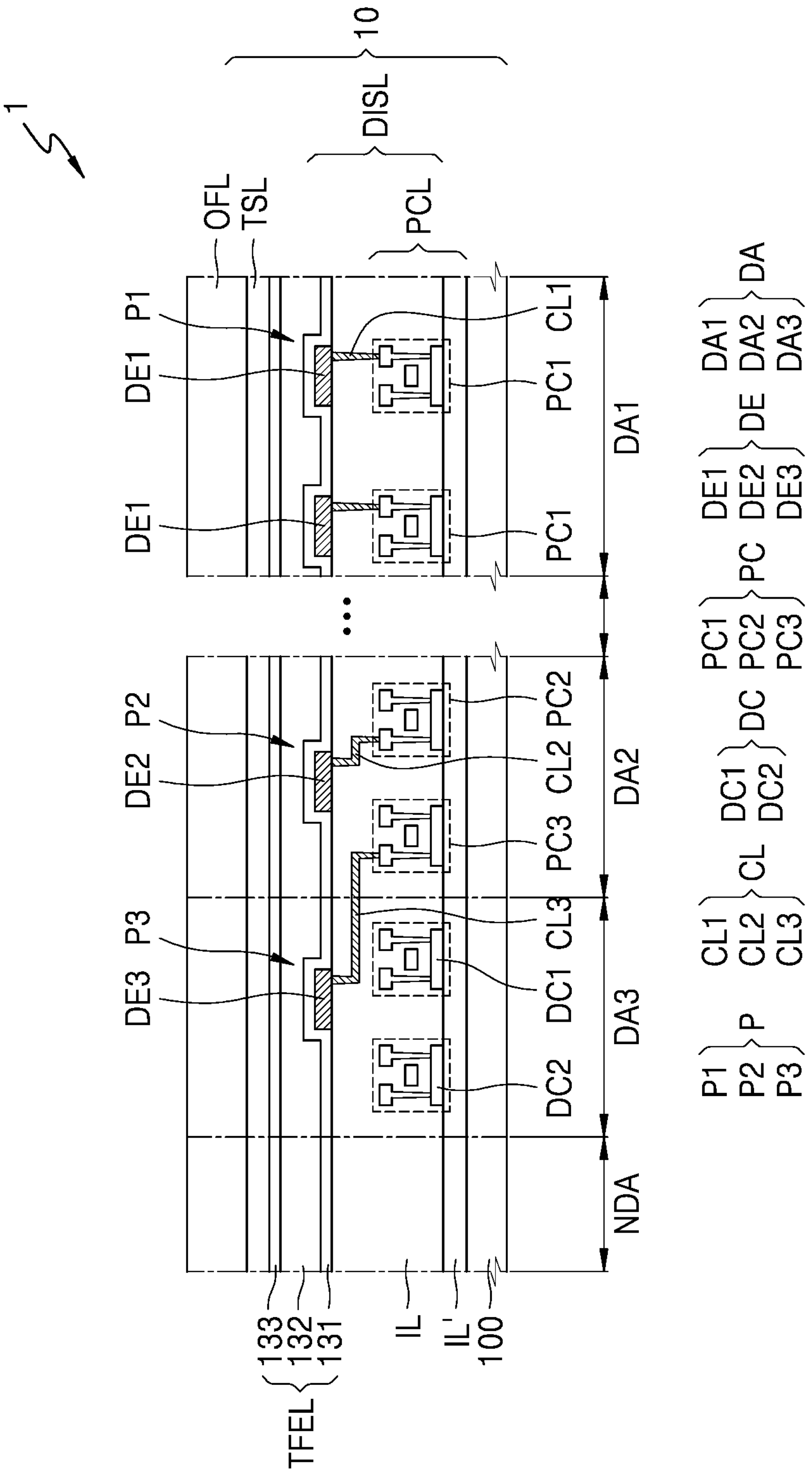
FIG. 2 is a schematic cross-sectional view of a portion of a display apparatus, according to an embodiment.

FIG. 2 is a schematic cross-sectional view of a portion of a display apparatus, according to an embodiment.

Referring to FIG. 2, in an embodiment, the display apparatus 1 may include a display panel 10. The display apparatus 1 may further include a support layer (not shown) that may overlap the display panel 10, and a cover window (not shown) for protecting the display panel 10 may be further disposed on the display panel 10.

The display panel 10 may include the substrate 100, a display layer DISL disposed on the substrate 100, a touch sensor layer TSL, and an optical functional layer OFL. The display panel 10 may include the display area DA and the non-display area NDA. The display area DA may include the first display area DA1, the second display area DA2, and the third display area DA3. In an embodiment, the first display area DA1, the second display area DA2, and the third display area DA3 may include at least one folding area.

The substrate 100 may include an insulating material, such as glass, quartz, or polymer resin. The substrate 100 may be a flexible substrate that is bendable, foldable, or rollable.

The display layer DISL may include a circuit layer PCL, display elements DE disposed on the circuit layer PCL, and an encapsulation layer, such as a thin-film encapsulation layer TFEL or a sealing substrate (not shown). Insulating layers IL and IL' may be arranged between the substrate 100 and the display layer DISL and in the display layer DISL. In an embodiment, the display element DE may be an organic light-emitting diode including an organic emission layer. Alternatively, the display element DE may be a light-emitting diode (LED). A size of the LED may be on a micro-scale or a nanoscale. In an embodiment, for example, the LED may be a micro-LED. Alternatively, the LED may be a nanorod LED. The nanorod LED may include gallium nitride (GaN). In an embodiment, a color conversion layer may be disposed on the nanorod LED. The color conversion layer may include quantum dots. Alternatively, the display element DE may be a quantum dot LED including a quantum dot emission layer. Alternatively, the display element DE may be an inorganic LED including an inorganic semiconductor.

The display area DA may include a first pixel P1, a second pixel P2, and a third pixel P3. The first pixel P1 may include a first pixel circuit PC1 and a first display element DE1 connected thereto. The first pixel circuit PC1 may include at least one thin-film transistor and control the emission of the first display element DE1. The second pixel P2 may include a second pixel circuit PC2 and a second display element DE2 connected thereto. The second pixel circuit PC2 may include at least one thin-film transistor and control the emission of the second display element DE2. The third pixel P3 may include a third pixel circuit PC3 and a third display element DE3 connected thereto. The third pixel circuit PC3 may include at least one thin-film transistor and control the emission of the third display element DE3.

The first pixel P1 may be arranged in the first display area DA1. That is, the first pixel circuit PC1, the first display element DE1, and a first connection line CL1 connecting the first pixel circuit PC1 to the first display element DE1 may be arranged in the first display area DA1.

The second pixel P2 may be arranged in the second display area DA2. That is, the second pixel circuit PC2, the second display element DE2, and a second connection line CL2 connecting the second pixel circuit PC2 to the second display element DE2 may be arranged in the second display area DA2.

The third pixels P3 may be distributed and arranged in the second display area DA2 and the third display area DA3. Referring to FIG. 2, the third pixel circuit PC3 may be located in the second display area DA2, and the third display element DE3 may be located in the third display area DA3. Thus, a third connection line CL3 connecting the third pixel circuit PC3 to the third display element DE3 may extend from the second display area DA2 to the third display area DA3.

The display area DA may further include driver circuits DC. The driver circuits DC may be configured to generate scan signals applied to, for example, a gate electrode of a switching thin-film transistor electrically connected to pixel electrodes in the display area DA. The driver circuits DC may include a first driver circuit DC1 and a second driver circuit DC2. In an embodiment, a type of the first driver circuit DC1 may be a scan driver circuit, and a type of the second driver circuit DC2 may be an emission driver circuit.

The driver circuits DC may be arranged in the third display area DA3. That is, the third display elements DE3 arranged in the third display area DA3 may overlap at least one of the driver circuits DC.

In the display apparatus 1 according to an embodiment, an area of the non-display area NDA where no pixels are arranged, that is, a dead space, may be substantially reduced. A driver circuit portion, a power supply line, etc. may be arranged near edges of the substrate 100. In a conventional display apparatus, display elements DE are not arranged in regions where a driver circuit portion, a power supply line, etc. are arranged, and thus, an area of a dead space is great.

However, referring to FIG. 2, in an embodiment of the display apparatus 1, the driver circuits DC such as the first driver circuit DC1 and the second driver circuit DC2 may be arranged in the display area DA, and some of the display elements DE are disposed on upper portions of the driver circuits DC. That is, the third display area DA3 that is the outermost side of the display area DA may include the driver circuits DC and the third display element DE overlapping the driver circuits DC. The third pixel circuit PC3 controlling the emission of the third display element DE3 may be located in the second display area DA2 as the third connection line CL3 extends. Accordingly, as the driver circuit portion, the power supply line, or the like may be located under the display elements DE, a dead space that may be generated because of the driver circuit portion or the power supply line may be effectively reduced.

Figure 3:
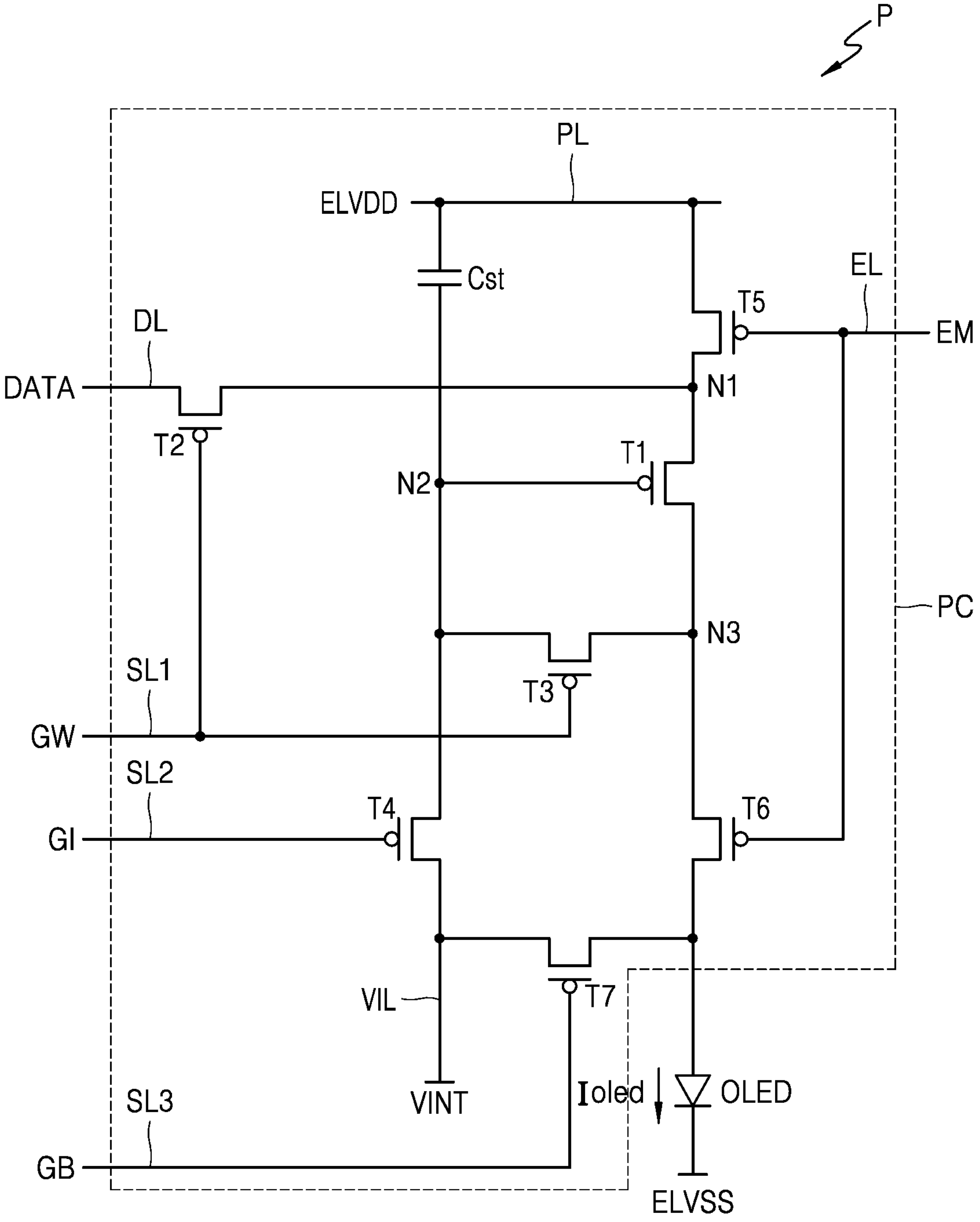
FIGS. 3 and 4 each are a schematic equivalent circuit diagram of any one of pixel circuits arranged in a display panel.
Figure 4:
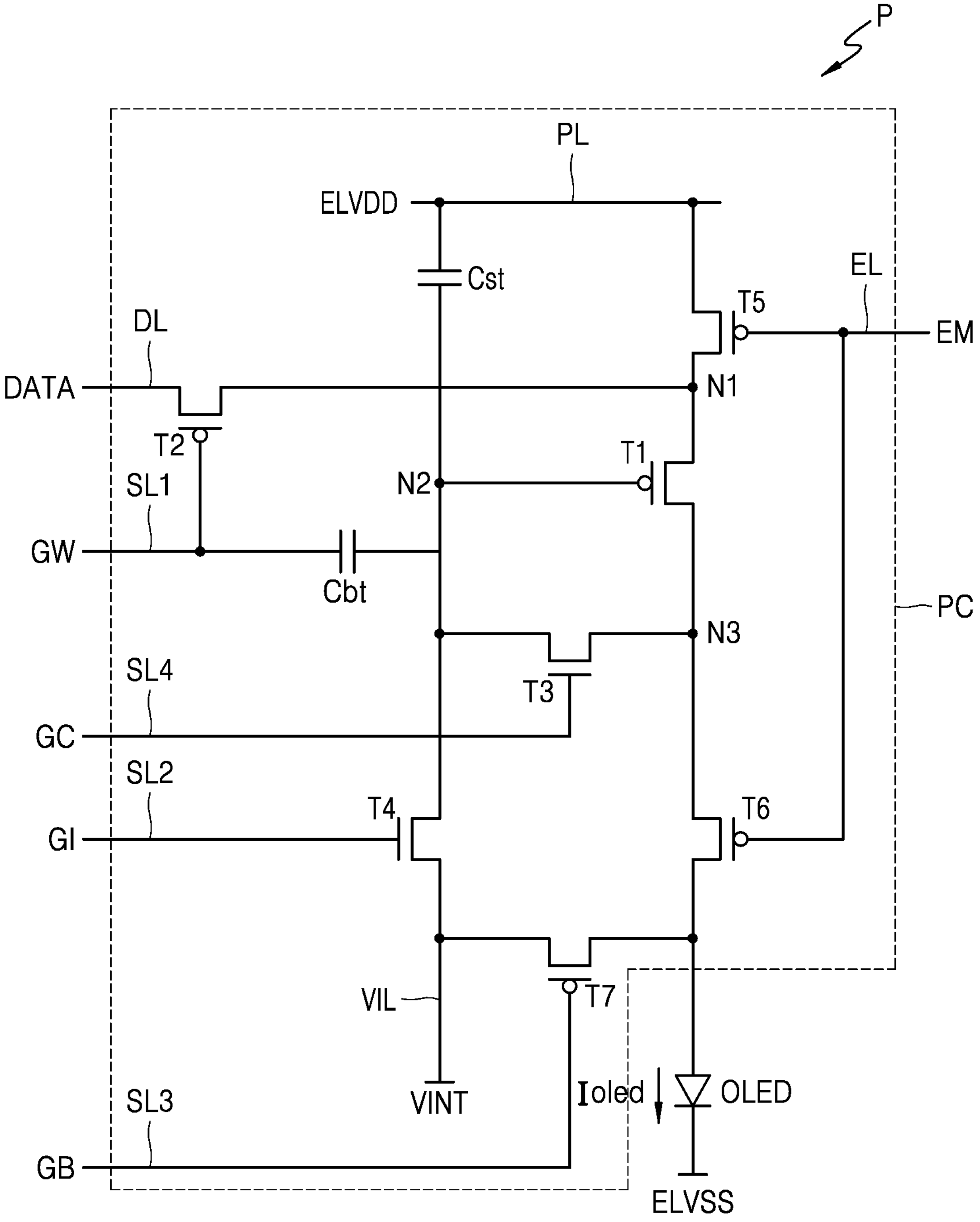

FIGS. 3 and 4 each are a schematic equivalent circuit diagram of any one of pixel circuits arranged in a display panel.

In an embodiment, the pixel circuits PC of pixels P shown in FIGS. 3 and 4 may be the first pixel circuit PC1 of the first pixel P1, the second pixel circuit PC2 of the second pixel P2, and the third pixel circuit PC3 of the third pixel P3. Hereinafter, the pixel circuit PC of the pixel P is referred to as a pixel circuit PC for convenience.

Referring to FIG. 3, in an embodiment, the pixel circuit PC may include a first transistor T1 to a seventh transistor T7. Depending on types (an N type or a P type) and/or operation conditions of transistors, a first terminal of a transistor may be a source electrode or a drain electrode, and a second terminal may be different from the first terminal. For example, when the first terminal is a source electrode, the second terminal may be a drain electrode.

The pixel circuit PC may be connected to a first scan line SL1 configured to transmit a first scan signal GW, a second scan line SL2 configured to transmit a second scan signal GI, a third scan line SL3 configured to transmit a third scan signal GB, an emission control line EL configured to transmit an emission control signal EM, a data line DL configured to transmit a data signal DATA, a driving power line PL configured to transmit a driving voltage ELVDD, and an initialization voltage line VIL configured to transmit an initialization voltage VINT. The pixel circuit PC may be connected to the organic light-emitting diode OLED as a display element.

The first transistor T1 may be connected between the driving power line PL and the organic light-emitting diode OLED. The first transistor T1 may be connected between a first node N1 and a third node N3. The first transistor T1 may be connected to the driving power line PL via the fifth transistor T5 and electrically connected to the organic light-emitting diode OLED via the sixth transistor T6. The first transistor T1 may include a gate electrode connected to a second node N2, a first terminal connected to the first node N1, and a second terminal connected to the third node N3. The driving power line PL may be configured to transmit the driving voltage ELVDD to the first transistor T1. The first transistor T1 may function as a driving transistor and receive a data signal DATA according to a switching operation of the second transistor T2, thereby providing a driving current Ioled to the organic light-emitting diode OLED.

The second transistor T2 (a data write transistor) may be connected between the data line DL and the first node N1. The second transistor T2 may be connected to the driving power line PL via the fifth transistor T5. The second transistor T2 may include a gate electrode connected to the first scan line SL1, a first terminal connected to the data line DL, and a second terminal connected to the first node N1. The second transistor T2 may be turned on in response to the first scan signal GW transmitted through the first scan line SL1 and perform a switching operation whereby a data signal DATA transmitted through the data line DL is transmitted to the first node N1.

The third transistor T3 (a compensation transistor) may be connected between the second node N2 and the third node N3. The third transistor T3 may be connected to the organic light-emitting diode OLED via the sixth transistor T6. The third transistor T3 may include a gate electrode connected to the first scan line SL1, a first terminal connected to the second node N2, and a second terminal connected to the third node N3. The third transistor T3 may be turned on in response to the first scan signal GW transmitted through the first scan line SL1 and diode-connect the first transistor T1, thus compensating for a threshold voltage of the first transistor T1.

The fourth transistor T4 (a first initialization transistor) may be connected between the second node N2 and the initialization voltage line VIL. The fourth transistor T4 may include a gate electrode connected to the second scan line SL2, a first terminal connected to the second node N2, and a second terminal connected to the initialization voltage line VIL. The fourth transistor T4 may be turned on in response to the second scan signal GI transmitted through the second scan line SL2 and configured to transmit the initialization voltage VINT to the gate electrode of the first transistor T1, thereby initializing the gate electrode of the first transistor T1.

The fifth transistor T5 (a first emission control transistor) may be connected between the driving power line PL and the first node N1. The sixth transistor T6 (a second emission control transistor) may be connected between the third node N3 and the organic light-emitting diode OLED. The fifth transistor T5 may include a gate electrode connected to the emission control line EL, a first terminal connected to the driving power line PL, and a second terminal connected to the first node N1. The sixth transistor T6 may include a gate electrode connected to the emission control line EL, a first terminal connected to the third node N3, and a second terminal connected to the pixel electrode of the organic light-emitting diode OLED. The fifth transistor T5 and the sixth transistor T6 may be simultaneously turned on in response to the emission control signal EM transmitted through the emission control line EL, and thus, a driving current may flow in the organic light-emitting diode OLED.

The seventh transistor T7 (a second initialization transistor) may be connected between the organic light-emitting diode OLED and the initialization voltage line VIL. The seventh transistor T7 may include a gate electrode connected to the third scan line SL3, a first terminal connected to the second terminal of the sixth transistor T6 and the pixel electrode of the organic light-emitting diode OLED, and a second terminal connected to the initialization voltage line VIL. The seventh transistor T7 may be turned on in response to the third scan signal GB transmitted through the third scan line SL3 and configured to transmit the initialization voltage VINT to the pixel electrode of the organic light-emitting diode OLED, thereby initializing the pixel electrode of the organic light-emitting diode OLED.

A capacitor Cst may include a first electrode connected to the gate electrode of the first transistor T1 and a second electrode connected to the driving power line PL. The capacitor Cst may store and maintain a voltage corresponding to a difference in voltages of the driving power line PL and the gate electrode of the first transistor T1 so that a voltage applied to the gate electrode of the first transistor T1 may be maintained.

The organic light-emitting diode OLED may include the pixel electrode (a first electrode or anode) and an opposite electrode (a second electrode or a cathode), and the opposite electrode may receive the common voltage ELVSS. The organic light-emitting diode OLED may receive the driving current from the first transistor T1 and emit light, and thus, images are displayed.

FIG. 3 shows an embodiment where the first transistor T1 to the seventh transistor T7 each are a P-type transistor. One or more embodiments are not limited thereto. In an alternative embodiment, for example, the first transistor T1 to the seventh transistor T7 may each be an N-type transistor, or some of the first transistor T1 to the seventh transistor T7 may each be an N-type transistor, and the others thereof may each be a P-type transistor. FIG. 4 shows an embodiment where the third transistor T3 and the fourth transistor T4 among the first transistor T1 to the seventh transistor T7 each are an N-type transistor, and the others thereof each are a P-type transistor. The third transistor T3 and the fourth transistor T4 may respectively include semiconductor layers including oxide, and the other transistors may respectively include semiconductor layers including silicon.

In an embodiment, as shown in FIGS. 3 and 4, an organic light-emitting diode OLED is employed as a display element, but in an alternative embodiment, an inorganic LED or a quantum dot LED may be employed as a display element.

Figure 5:
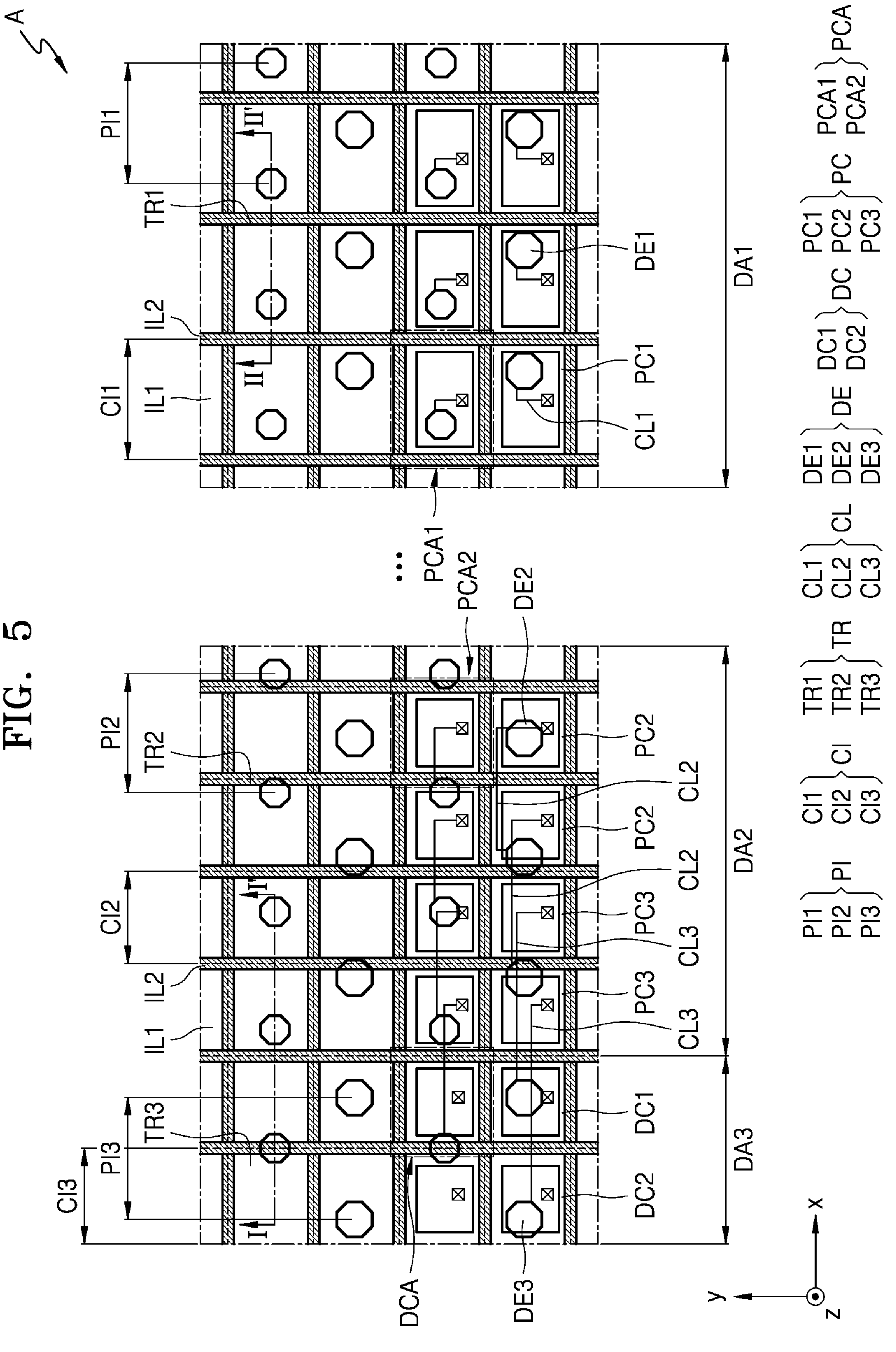
FIG. 5 is a schematic plan view of pixel areas of a display apparatus, according to an embodiment.

FIG. 5 is a schematic plan view of pixel areas of a display apparatus, according to an embodiment. FIG. 5 is a schematic plan view showing a portion of a display panel that corresponds to the region A of FIG. 1.

Referring to FIG. 5, in an embodiment, the display area DA of the display panel 10 may include a plurality of pixel circuit areas PCA and a plurality of driver circuit areas DCA. The pixel circuit areas PCA and the driver circuit areas DCA may be repeatedly arranged in an x direction and a y direction. Here, a z direction perpendicular to the x direction and the y direction may be a thickness direction of the display panel 10. The pixel circuit area PCA may be an area where a pixel circuit PC of a pixel and signal lines connected to the pixel circuit PC are arranged. The driver circuit area DCA may be an area where a driver circuit DC and signal lines connected thereto are arranged.

The pixel circuit areas PCA may include first pixel circuit areas PCA1 and second pixel circuit areas PCA2. The first pixel circuit area PCA1 may be located in the first display area DA1. The first pixel circuit area PCA1 may be an area where any one of the first pixel circuits PC1 in the first display area DA1 is arranged. The second pixel circuit area PCA2 may be located in the second display area DA2. The second pixel circuit area PCA2 may be an area where one of the second pixel circuits PC2 and the third pixel circuits PC3 in the second display area DA2 is arranged.

The driver circuit areas DCA may be located in the third display area DA3. The driver circuit areas DCA may each be an area where one of the first driver circuits DC1 and the second driver circuits DC2 in the third display area DA3 is arranged. In an embodiment, the first driver circuits DC1 may each be a scan driver circuit, and the second driver circuits DC2 may each be an emission driver circuit. The second driver circuits DC2 may be located farther away or more outwardly than the first driver circuits DC1.

The display element DE may be disposed on an upper layer of the pixel circuit PC and the driver circuit DC. The display element DE may be disposed on the pixel circuit PC to overlap the pixel circuit PC or may be offset from the pixel circuit PC and arranged to partially overlap a pixel circuit PC of another pixel in an adjacent row and/or column. Alternatively, the display element DE may not overlap the pixel circuit PC connected thereto. In an embodiment, the display element DE may be an organic light-emitting diode OLED.

The first display elements DE1 may be arranged in the first display area DA1, the second display elements DE2 may be arranged in the second display area DA2, and the third display elements DE3 may be arranged in the third display area DA3. The first display elements DE1, the second display elements DE2, and the third display elements DE3 may be evenly arranged in the first display area DA1, the second display area DA2, and the third display area DA3, respectively. In an embodiment, a first display element distance PI1 that is the distance between adjacent first display elements DE1 in the first direction (e.g., an x direction) in the first display area DA1, a second display element distance PI2 that is the distance between adjacent second display elements DE2 in the first direction in the second display area DA2, and a third display element distance PI3 that is the distance between adjacent third display elements DE3 in the first direction in the third display area DA3 may be substantially the same as each other.

In an embodiment, the first display area DA1 may include the first pixel circuit areas PCA1, and the first pixel circuits PC1 respectively connected to the first display elements DE1 may be arranged in the first pixel circuit areas PCA1. In such an embodiment, the first display elements DE1 may overlap the first pixel circuits PC1. The first display element DE1 may be disposed to entirely overlap a connected one of the first pixel circuits PC1 (i.e., one first pixel circuit connected thereto) and connected to the connected one of the first pixel circuits PC1.

The second display area DA2 may include the second pixel circuit areas PCA2, and in the second pixel circuit areas PCA2, the second pixel circuits PC2 respectively connected to the second display elements DE2 and the third pixel circuits PC3 respectively connected to the third display elements DE3 may be arranged. In an embodiment, some (or at least one) of the second display elements DE2 may overlap the second pixel circuits PC2, and the others of the second display elements DE2 may overlap the third pixel circuits PC3. In such an embodiment, the second display element DE2 may be arranged to entirely overlap a connected one of the second pixel circuits PC2 or may be offset from (or partially overlap) the connected one of the second pixel circuits PC2 and thus overlap at least a portion of another second pixel circuit PC2 and another third pixel circuit PC3 arranged in an adjacent row and/or column.

The third display area DA3 may include the driver circuit areas DCA, and in the driver circuit areas DCA, the first driver circuits DC1 and the second driver circuits DC2 may be arranged, respectively. In an embodiment, the third display elements DE3 may overlap at least one selected from the first driver circuits DC1 and the second driver circuits DC2. That is, the third display elements DE3 may be connected to the third pixel circuits PC3 arranged in the second display area DA2 and may be disposed above the first driver circuits DC1 and the second driver circuits DC2.

Also, in the display area DA, connection lines CL connecting the display elements DE to the pixel circuits PC may be further included. The connection lines CL may include the first connection lines CL1, the second connection lines CL2, and the third connection lines CL3. In such an embodiment, as described above, the first connection line CL1 may connect the first pixel circuit PC1 to the first display element DE1, the second connection line CL2 may connect the second pixel circuit PC2 to the second display element DE2, and the third connection line CL3 may connect the third pixel circuit PC3 to the third display element DE3.

Accordingly, the first connection line CL1 may be arranged in the first display area DA1, the second connection line CL2 may be arranged in the second display area DA2, and the third connection line CL3 may extend from the second display area DA2 to the third display area DA3 and may be arranged in the second display area DA2 and the third display area DA3. In an embodiment, the first connection line CL1 may be arranged in the first pixel circuit area PCA1 where each first pixel circuit PC1 and the first display element DE1 connected to the first pixel circuit PC1 are arranged. When the second display element DE2 overlaps the second pixel circuit PC2 arranged in a row and/or a column that is adjacent to the second pixel circuit PC2 connected to the second display element DE2, the second connection line CL2 may cross a plurality of trenches TR and overlap the second pixel circuit areas PCA2. Because the display element DE3 is arranged in the third display area DA3 and the third pixel circuit PC3 connected to the third display element DE3 is arranged in the second display area DA2, the third connection line CL3 may overlap the second pixel circuit areas PCA2, which cross the trenches TR2 and are located in the second display area DA2, and the driver circuit areas DCA located in the third display area DA3. Thus, lengths of the second connection lines CL2 and the third connection lines CL3 may be greater than those of the first connection lines CL1.

The first pixel circuit areas PCA1, the second pixel circuit areas PCA2, and the driver circuit areas DCA may be arranged in the first direction. Referring to FIG. 5, the display area DA may include the trenches TR defined or formed along boundaries of the first pixel circuit areas PCA1, the second pixel circuit areas PCA2, and the driver circuit areas DCA. That is, the trenches TR respectively surround the first pixel circuit areas PCA1, the second pixel circuit areas PCA2, and the driver circuit areas DCA in a plan view or when viewed in a third direction (e.g., the z direction). The trench TR may be referred to as a groove.

The trenches TR may include first trenches TR1 formed in the first display area DA1, second trenches TR2 formed in the second display area DA2, and third trenches TR3 formed in the third display area DA3. The first trenches TR1 may respectively correspond to (or be defined along) boundaries of first pixel circuit areas PCA1 that are adjacent to each other in the first direction (e.g., the x direction) among the first pixel circuit areas PCA1, and the second trenches TR2 may respectively correspond to boundaries of second pixel circuit areas PCA2 that are adjacent to each other in the first direction among the second pixel circuit areas PCA2. The third trenches TR3 may respectively correspond to boundaries of driver circuit areas DCA that are adjacent to each other in the first direction among the driver circuit areas DCA.

The trenches TR may be defined or formed in a first insulating layer IL1 described below and each have a shape from which a portion of the first insulating layer IL1 is removed. In an embodiment, the first insulating layer IL1 may be an inorganic insulating layer and include insulating layers. A second insulating layer IL2 may be buried (or filled) in the trenches TR. The second insulating layer IL2 may be an organic insulating layer. Because the second insulating layer IL2 buried in the trenches TR includes an organic material, the propagation of cracks, which may occur in the first insulating layer IL1 of a pixel because of external impact, may be effectively prevented or substantially reduced. In an embodiment, structures of the trenches TR of a display apparatus may be defined or formed between the first pixel circuit PC1, the second pixel circuit PC2, and the third pixel circuit PC3 and also between the driver circuits DC. Accordingly, when cracks, etc. occur in an area where the pixel circuit PC is arranged as well as an area where the driver circuit DC is arranged, the third trenches TR3 may reduce the growth of cracks or damage. That is, in the display apparatus according to an embodiment, the driver circuits DC are arranged in the display area DA, and thus, the dead space may be reduced and the display apparatus may be robust to the external impact.

A planar area (or an area in a plan view or when view in the third direction) of the first pixel circuit area PCA1 that is an area where each of the first pixel circuits PC1 is arranged may be greater than a planar area of the second pixel circuit area PCA2 that is an area where each of the second pixel circuits PC2 and each of the third pixel circuits PC3 are arranged. A planar area of the first pixel circuit area PCA1 may be greater than a planar area of the driver circuit area DCA that is an area where each of the driver circuits DC is arranged. In an embodiment, as shown in FIG. 5, vertical lengths of the first pixel circuit area PCA1, the second pixel circuit area PCA2, and the driver circuit area DCA in the second direction (e.g., the y direction) may be the same as each other. In such an embodiment, a horizontal length of the first pixel circuit area PCA1 in the first direction may be greater than a horizontal length of the second pixel circuit area PCA2 and a horizontal length of the driver circuit area DCA in the first direction.

In this case, the horizontal length of the first pixel circuit area PCA1 may be referred to as a first circuit area distance CI1, the horizontal length of the second pixel circuit area PCA2 may be referred to as a second circuit area distance CI2, and the horizontal length of the driver circuit area DCA may be referred to as a third circuit area distance CI3. That is, the first circuit area distance CI1 may be greater than the second circuit area distance CI2 and the third circuit area distance CI3.

Also, a first trench distance between two adjacent first trenches TR1 in the first direction may be the same as the first circuit area distance CI1, a second trench distance between two adjacent second trenches TR2 in the first direction may be the same as the second circuit area distance CI2, and a third trench distance between two adjacent third trenches TR3 in the first direction may be the same as the third circuit area distance CI3. Accordingly, the first trench distance may be greater than the second trench distance and the third trench distance.

As a result, the pixel circuits PC and the driver circuits DC may have higher densities (i.e., pixel density or the number of pixels per unit area) in the second display area DA2 and the third display area DA3 than in the first display area DA1. Because the third pixel circuit PC3 may not be arranged under the third display element DE3, which is arranged in the third display area DA3, to overlap the third display element DE3 as the driver circuit DC is arranged in the third display area DA3, it is desired to arrange the third pixel circuits PC3 in an adjacent second display area DA2. Accordingly, because the second display area DA2 has to include the second pixel circuits PC2 and the third pixel circuits PC3, the second pixel circuit areas PCA2, where the second pixel circuits Pc2 and the third pixel circuits Pc3 are respectively arranged, may be smaller than the first pixel circuit areas PCA1.

Figure 6:
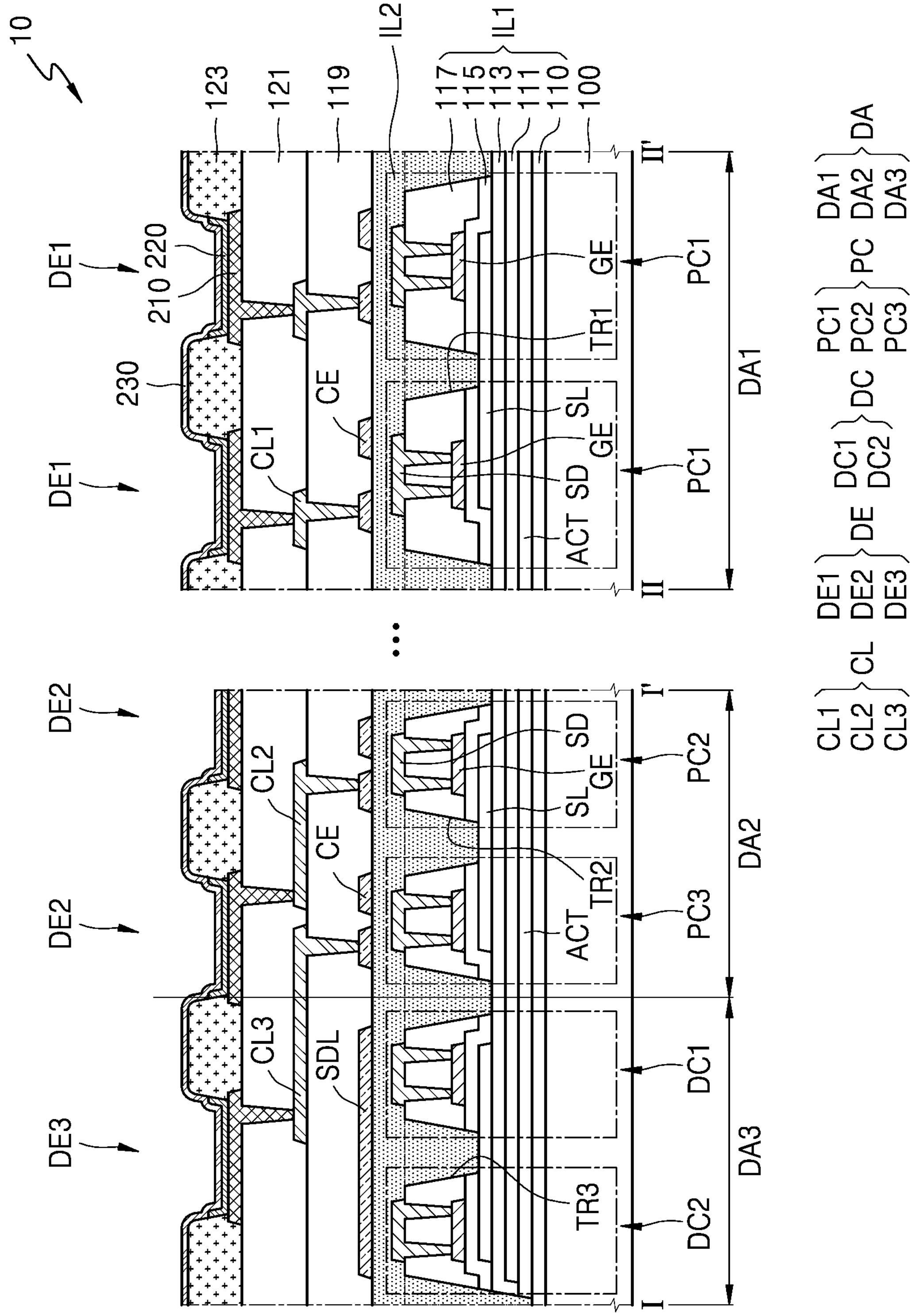
FIG. 6 is a schematic cross-sectional view of a portion of a display apparatus, taken along line I-I' and line II-II' of FIG. 5.

FIG. 6 is a schematic cross-sectional view of a portion of a display apparatus, taken along line I-I' and line II-II' of FIG. 5.

Referring to FIG. 6, in an embodiment, the display panel 10 may include the first display area DA1, the second display area DA2, and the third display area DA3. As described above with reference to FIG. 5, the first pixel circuits PC1 may be arranged in the first display area DA1, and the second pixel circuits PC2 and the third pixel circuits PC3 may be arranged in the second display area DA2. In the third display area DA3, the first driver circuits DC1 and the second driver circuits DC2 may be arranged.

The first display elements DE1 respectively and electrically connected to the first pixel circuits PC1 may be arranged in the first display area DA1, and the second display elements DE2 respectively and electrically connected to the second pixel circuits PC2 may be arranged in the second display area DA2. In the third display area DA3, the third display elements DE3 respectively and electrically connected to the third pixel circuits PC3 may be arranged. Accordingly, the second display elements DE2 may overlap one of the second pixel circuits PC2 and the third pixel circuits PC3, and the third display elements DE3 may overlap one of the driver circuits DC.

The display panel 10 may further include the connection line CL to connect the display element DE to the pixel circuit PC. The first connection line CL1 connecting the first display element DE1 to the first pixel circuit PC1 may be arranged in the first display area DA1. The second connection line CL2 connecting the second display element DE2 to the second pixel circuit PC2 may be arranged in the second display area DA2. The third connection line CL3 connecting the third display element DE3 to the third pixel circuit PC3 may extend from the second display area DA2 to the third display area DA3 and may be arranged in the second display area DA2 and the third display area DA3.

Hereinafter, configurations included in the display panel 10 will be described in detail according to the stack structure with reference to FIG. 6.

The substrate 100 may include a glass material or polymer resin. The polymer resin may include polyethersulfone, polyacrylate, polyetherimide, polyethylene naphthalate, polyethylene terephthalate, polyphenylene sulfide, polyarylate, polyimide, polycarbonate, cellulose acetate propionate, or the like. The substrate 100 including the polymer resin may be flexible, rollable, or bendable. The substrate 100 may have a multilayered structure that includes a layer including the above polymer resin and an inorganic layer (not shown).

A barrier layer 110 may be disposed on the substrate 100. The barrier layer 110 may prevent or decrease the penetration of impurities from the substrate 100, etc. to a first semiconductor layer Act1 and a second semiconductor layer Act2. The barrier layer 110 may include an inorganic material, such as oxide or nitride, an organic material, or a compound of organic and inorganic materials and have a single-layer structure or a multilayered structure including organic and inorganic materials.

A buffer layer 111 of the first insulating layer IL1 may be disposed on the barrier layer 110. The first insulating layer IL1 may include silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like. The first insulating layer IL1 may include the buffer layer 111, a first gate insulating layer 113, a second gate insulating layer 115, and an interlayer insulating layer 117.

A semiconductor layer ACT may be disposed on the buffer layer 111. The semiconductor layer ACT may include amorphous silicon or polysilicon. In an alternative embodiment, the semiconductor layer ACT may include an oxide of at least one material selected from indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). The semiconductor layer ACT may include a channel area and a source area and a drain area arranged on both sides of the channel area. The semiconductor layer ACT may have a single-layer structure or a multilayered structure.

The first gate insulating layer 113 may be disposed on the buffer layer 111 to cover the semiconductor layer ACT. A signal line SL may be disposed on the first gate insulating layer 113. The signal line SL may include a conductive material including molybdenum (Mo), Al, copper (Cu), or Ti and may have a single-layer structure or a multilayered structure including the above material. In an embodiment, for example, the signal line SL may be a single Mo layer.

The second gate insulating layer 115 may be disposed on the first gate insulating layer 113 to cover the signal line SL. A gate electrode GE may be disposed on the second gate insulating layer 115. The gate electrode GE may include a conductive material including Mo, Al, Cu, or Ti and may have a single-layer structure or a multilayered structure including the above material. In an embodiment, for example, the gate electrode GE may be a single Mo layer.

The interlayer insulating layer 117 may be disposed on the second gate insulating layer 115 to cover the gate electrode GE. A source drain electrode SD may be disposed on the interlayer insulating layer 117. The source drain electrode SD may be connected to a lower electrode through at least one contact hole defined or formed in the interlayer insulating layer 117. The source drain electrode SD may include a conductive material including Mo, Al, Cu, or Ti and may have a single-layer structure or a multilayered structure including the above material. In an embodiment, for example, the source drain electrode SD may have a multilayered structure of Ti/Al/Ti.

Also, the trenches TR may be defined or formed in the first insulating layer IL1. The trenches TR may be defined or formed in at least one of the buffer layer 111, the first gate insulating layer 113, the second gate insulating layer 115, and the interlayer insulating layer 117. In an embodiment, the trenches TR may be formed by penetrating (or removing a portion of) the second gate insulating layer 115 and the interlayer insulating layer 117. That is, as shown in FIG. 6, as the trenches TR is defined by openings defined or formed in the second gate insulating layer 115 and the interlayer insulating layer 117, a portion of the signal line SL may be exposed. However, one or more embodiments are not limited thereto, and the trenches TR may be formed by penetrating only the interlayer insulating layer 117.

The trenches TR may include the first trenches TR1 arranged in the first display area DA1, the second trenches TR2 arranged in the second display area DA2, and the third trenches TR3 arranged in the third display area DA3. That is, the first trenches TR1 may be arranged between first pixel circuits PC1 that are adjacent to each other. The second trenches TR2 may be arranged between the second pixel circuits PC2 and the third pixel circuits PC3 that are adjacent to each other. The third trenches TR3 may be arranged between the driver circuits DC that are adjacent to each other.

The second insulating layer IL2 may be disposed on the interlayer insulating layer 117 to cover the source drain electrode SD. A portion of the second insulating layer IL2 may be buried in the first trench TR1 to the third trench TR3, and other portions of the second insulating layer IL2 may be disposed on the interlayer insulating layer 117. The second insulating layer IL2 may include a material different from that in the first insulating layer IL1. The second insulating layer IL2 may have a single-layer structure or a multilayered structure including an organic material and provide a flat upper surface. The second insulating layer IL2 may include a general-purpose polymer, such as benzocyclobutene (BCB), polyimide, hexamethyldisiloxane (HMDSO), polymethylmethacrylate (PMMA), or polystyrene (PS), a polymer derivative having a phenol-based group, an acryl-based polymer, an imide-based polymer, an aryl-ether-based polymer, an amide-based polymer, a fluorine-based polymer, a p-xylene-based polymer, a vinyl alcohol-based polymer, or any blend thereof. As the second insulating layer IL2 is buried in the first trench TR1 to the third trench TR3, a step difference in the first insulating layer IL1 that is generated because of the first trench TR1 to the third trench TR3 may be removed or reduced.

In an embodiment, as a portion of the signal line SL is exposed through the trenches TR and a portion of the second insulating layer IL2 is buried in the trenches TR, the second insulating layer IL2 may contact the signal line SL. That is, some portions of the signal line SL, which overlap the trenches TR, may extend continuously across the trenches TR without a short circuit and thus may electrically connect portions between the pixel circuit areas PCA and the driver circuit areas DCA. Accordingly, in a display apparatus according to an embodiment, an additional conductive layer may not be arranged, where the additional conductive layer is used to connect portions of the signal line SL to each other when the signal line SL is disconnected because of the trenches TR. As a result, because a space may be provided by omitting the additional conductive layer, a display apparatus may become robust to external impact and have improved resolution.

A connection electrode CE may be disposed on the second insulating layer IL2. Although not shown in FIG. 6, some connection electrodes CE may be connected to the source drain electrode SD through a contact hole defined or formed in the second insulating layer IL2. The connection electrode CE may include a conductive material including Mo, Al, Cu, or Ti and may have a single-layer structure or a multilayered structure including the above material. In an embodiment, for example, the connection electrode CE may have a multilayered structure of Ti/Al/Ti.

in an embodiment, a shielding layer SDL may be disposed on the second insulating layer IL2. The shielding layer SDL may be arranged between the driver circuit DC and the third display element DE3 and prevent the driver circuit DC from being affected by electrical signals applied to the third display element DE3. In an embodiment, the shielding layer SDL may be arranged between the second insulating layer IL2 and a third insulating layer 119. In such an embodiment, as shown in FIG. 6, the shielding layer SDL may be simultaneously formed by using a same material as other conductive layers, such as the connection electrode CE arranged between the second insulating layer IL2 and the third insulating layer 119. The shielding layer SDL may overlap the driver circuit DC.

A constant voltage may be applied to the shielding layer SDL to ensure the shielding layer SDL to surely prevent the driver circuit DC from being affected by electrical signals applied to the third display element DE3. In an embodiment, for example, the shielding layer SDL may be grounded. Alternatively, the shielding layer SDL may be electrically connected to an electrode power supply line. In some embodiments, the shielding layer SDL may be defined by a portion of a power supply line.

The third insulating layer 119 may be disposed on the second insulating layer IL2 to cover the connection electrode CE and the shielding layer SDL. The third insulating layer 119 may have a single-layer structure or a multilayered structure including an organic material and provide a flat upper surface. The third insulating layer 119 may include a general-purpose polymer, such as BCB, polyimide, HMDSO, PMMA, or PS, a polymer derivative having a phenol-based group, an acryl-based polymer, an imide-based polymer, an aryl-ether-based polymer, an amide-based polymer, a fluorine-based polymer, a p-xylene-based polymer, a vinyl alcohol-based polymer, or any blend thereof.

The connection line CL may be disposed on the third insulating layer 119. The connection line CL may include the first connection line CL1 connecting the first display element DE1 to the first pixel circuit PC1, the second connection line CL2 connecting the second display element DE2 to the second pixel circuit PC2, and the third connection line CL3 connecting the third display element DE3 to the third pixel circuit PC3. The connection line CL may be connected to the connection electrode CE through at least one contact hole formed in the third insulating layer 119. The connection line CL may include a conductive material including Mo, Al, Cu, or Ti and may have a single-layer structure or a multilayered structure including the above material. In an embodiment, for example, the connection line CL may have a multilayered structure of Ti/Al/Ti. However, one or more embodiments are not limited thereto, and the connection line CL may include a same material as a pixel electrode 210 described below. Alternatively, a portion of the connection line CL may include a conductive material including Mo, Al, Cu, or Ti, and other portions of the connection line CL may include a same material as the pixel electrode 210.

A fourth insulating layer 121 may be disposed on the third insulating layer 119 to cover the connection line CL. The fourth insulating layer 121 may have a single-layer structure or a multilayered structure including an organic material and provide a flat upper surface. The fourth insulating layer 121 may include a general-purpose polymer, such as BCB, polyimide, HMDSO, PMMA, or PS, a polymer derivative having a phenol-based group, an acryl-based polymer, an imide-based polymer, an aryl-ether-based polymer, an amide-based polymer, a fluorine-based polymer, a p-xylene-based polymer, a vinyl alcohol-based polymer, or any blend thereof.

The first display element DE1 to the third display element DE3 may be disposed on the fourth insulating layer 121. The first display element DE1 to the third display element DE3 may be organic light-emitting diodes OLED. Each of the first display element DE1 to the third display element DE3 may include the pixel electrode 210, an intermediate layer 220 including an organic emission layer, and an opposite electrode 230. The first display element DE1 to the third display element DE3 may be connected to the connection lines CL through at least one contact hole defined or formed in the fourth insulating layer 121.

The pixel electrode 210 may be a (semi-)light-transmissive electrode or a reflection electrode. In some embodiments, the pixel electrode 210 may include a reflection layer including silver (Ag), magnesium (Mg), Al, platinum (Pt), palladium (Pd), gold (Au), nickel (Ni), neodymium (Nd), iridium (Ir), chromium (Cr), or a combination thereof, and a transparent or translucent electrode layer formed on the reflection layer. The transparent or translucent electrode layer may include at least one material selected from indium tin oxide (ITO), indium zinc oxide (IZO), zinc oxide (ZnO), indium oxide ($In_2O_3$), indium gallium oxide (IGO), and aluminum zinc oxide (AZO). In some embodiments, the pixel electrode 210 may have a multilayered structure of ITO/Ag/ITO.

In the display area of the substrate 100, a bank layer 123 may be disposed on the fourth insulating layer 121. The bank layer 123 may cover edges of the pixel electrode 210 and be provided with an opening defined therethrough to expose a central portion of the pixel electrode 210. An emission area of each of the first display element DE1 to the third display element DE3 may be defined by the opening. The bank layer 123 may increase the distance between the edge of the pixel electrode 210 and the opposite electrode 230 disposed on the pixel electrode 210 and thus may prevent arcs, etc. from being generated on the edge of the pixel electrode 210.

The bank layer 123 may include at least one organic insulating materials selected from polyimide, polyamide, acryl resin, BCB, and phenol resin and may be formed through a spin coating method or the like. The bank layer 123 may include an organic insulating material. Alternatively, the bank layer 123 may include an inorganic insulating material, such as silicon nitride, silicon oxynitride, or silicon oxide. Alternatively, the bank layer 123 may include an organic insulating material and an inorganic insulating material. In some embodiments, the bank layer 123 may include a light-shielding material and may be black. The light-shielding material may include carbon black, a carbon nanotube, resin or paste including a black dye, metal particles such as Ni, Al, Mo, and an alloy thereof, metal oxide particles (e.g., chromium oxide), or metal nitride particles (e.g., chromium nitride), or the like. In an embodiment where the bank layer 123 includes the light-shielding material, external reflection from metal structures arranged under the bank layer 123 may decrease.

The intermediate layer 220 may be arranged in the opening defined or formed in the bank layer 123 and include the organic emission layer. The organic emission layer may include an organic material including a fluorescent or phosphorescent material emitting red light, green light, blue light, or white light. The organic emission layer may include a low-molecular-weight or a high-molecular-weight organic material, and on and under the organic emission layer, a functional layer such as a hole transport layer (HTL), a hole injection layer (HIL), an electron transport layer (ETL), or an electron injection layer (EIL) may be selectively arranged.

The opposite electrode 230 may be a light-transmissive electrode or a reflection electrode. In some embodiments, the opposite electrode 230 may be a transparent or translucent electrode and may include a metal thin-film having a low work function and including Li, Ca, LiF/Ca, LiF/Al, Al, Ag, Mg, or a compound thereof. Also, a transparent conductive oxide (TCO) layer including ITO, IZO, ZnO, or $In_2O_3$ may be further disposed on the metal thin-film. The opposite electrode 230 may be arranged over the display area DA and disposed on the intermediate layer 220 and the bank layer 123. The opposite electrode 230 may be integrally formed over the first display element DE1 to the third display element DE3 as a single and unitary body and correspond to the pixel electrodes 210.

The display elements DE may be easily damaged by external moisture, oxygen, or the like so that an encapsulation layer (not shown) may cover the display elements DE to protect the display elements DE. The encapsulation layer may cover the display area and extend to at least a portion of the peripheral area. The encapsulation layer may include a first inorganic encapsulation layer, an organic encapsulation layer, and a second inorganic encapsulation layer.

Figure 7:
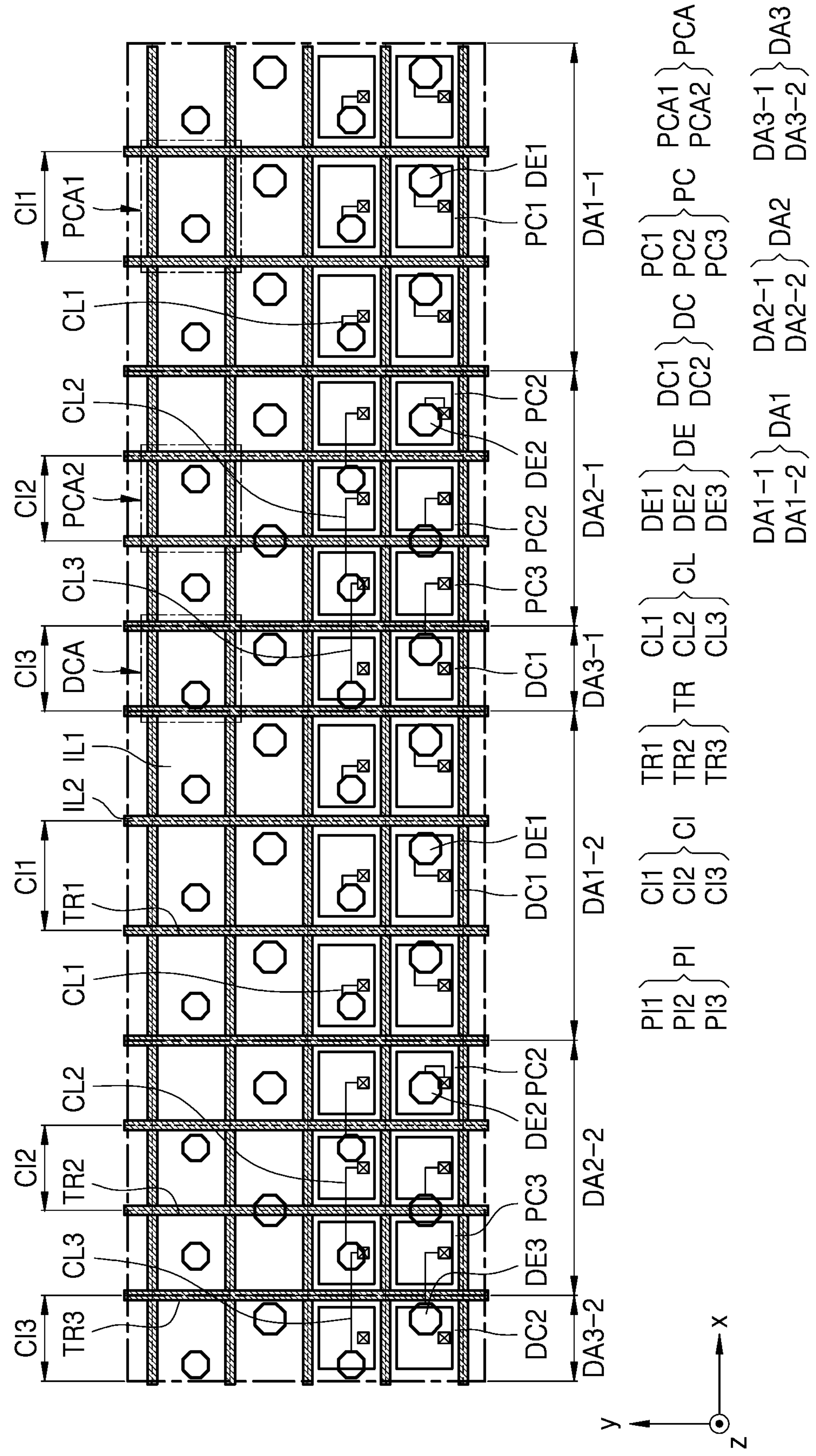
FIG. 7 is a schematic plan view of pixel areas of a display apparatus, according to an alternative embodiment.
Figure 8:
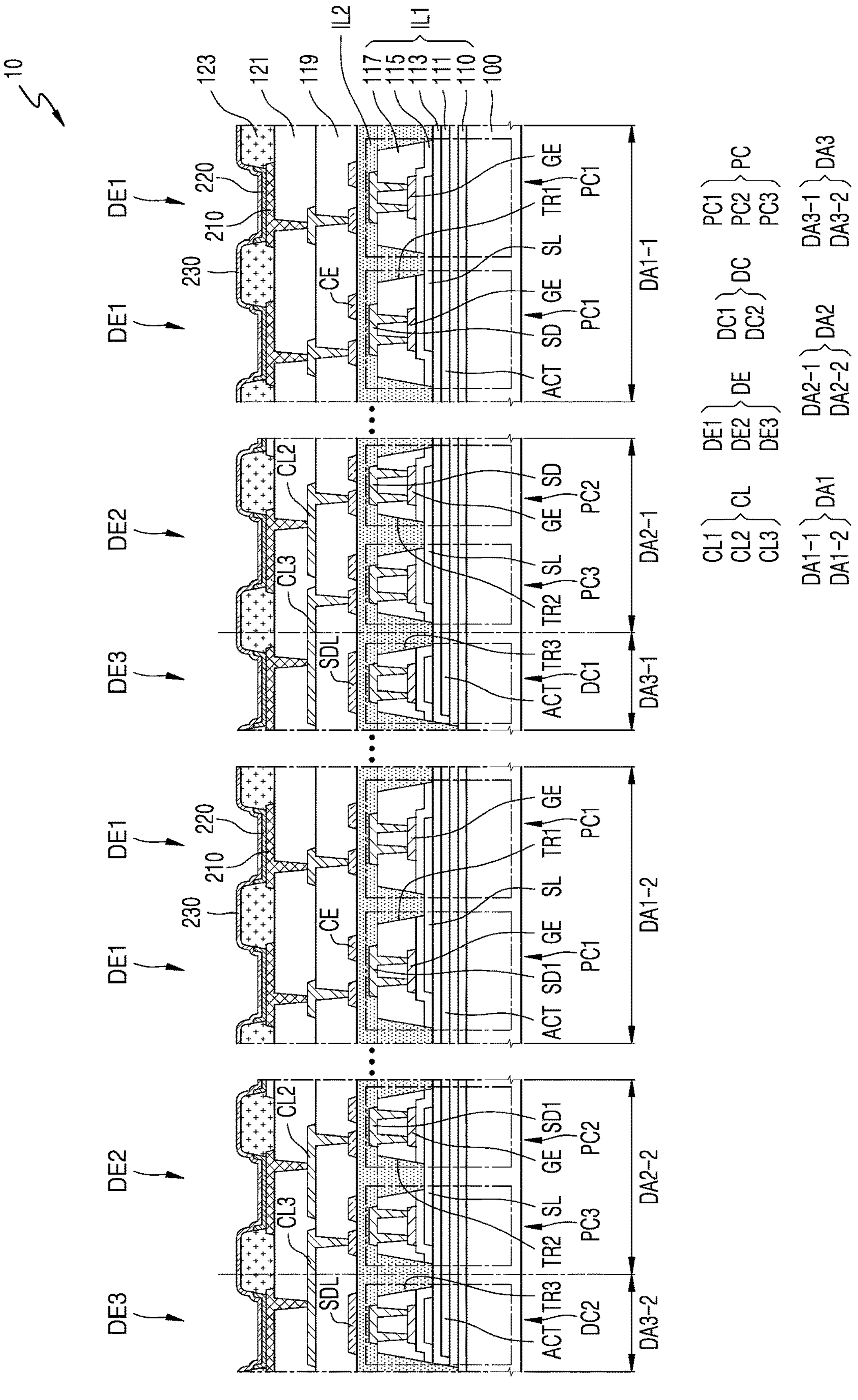
FIG. 8 is a schematic cross-sectional view of a portion of a display apparatus, according to an alternative embodiment.

FIG. 7 is a schematic plan view of pixel areas of a display apparatus, according to an alternative embodiment, and FIG. 8 is a schematic cross-sectional view of a portion of a display apparatus, according to an alternative embodiment. The embodiment of the display apparatus shown in FIGS. 7 and 8 is substantially the same as the embodiment of the display apparatus shown in FIGS. 5 and 6, except for features regarding the arrangement of the display area. Any repetitive detailed descriptions of the same or like elements shown in FIGS. 7 and 8 as those described above with reference to FIGS. 5 and 6 will be omitted or simplified, and differences therebetween will be mainly described hereinafter.

Referring to FIG. 7, in an embodiment, the display area DA of the display panel 10 may include the first display area DA1, the second display area DA2, and the third display area DA3. In such an embodiment, as shown in FIG. 7, the first display area DA1 may be divided into a first portion DA1-1 and a second portion DA1-2 of the first display area DA1, the second display area DA2 may be divided into a first portion DA2-1 and a second portion DA2-2 of the second display area DA2, and the third display area DA3 may be divided into a first portion DA3-1 and a second portion DA3-2 of the third display area DA3.

In such an embodiment, the first portion DA2-1 of the second display area DA2 may be located on an outer side of the first portion DA1-1 of the first display area DA1, and the first portion DA3-1 of the third display area DA3 may be located on an outer side of the first portion DA2-1 of the second display area DA2. The second portion DA1-2 of the first display area DA1 may be located on an outer side of the first portion DA3-1 of the third display area DA3, the second portion DA2-2 of the second display area DA2 may be located on an outer side of the second portion DA1-2 of the first display area DA1, and the second portion DA3-2 of the third display area DA3 may be located on an outer side of the second portion DA2-2 of the second display area DA2.

In such an embodiment, the first portion DA1-1 and the second portion DA1-2 of the first display area DA1 may include the first pixel circuit areas PCA1. The first pixel circuit area PCA1 may be an area where any one of the first pixel circuits PC1 is arranged. Thus, the first portion DA1-1 and the second portion DA1-2 of the first display area DA1 may include the first pixel circuit PC1 and the first display element DE1 connected thereto.

In such an embodiment, the first portion DA2-1 and the second portion DA2-2 of the second display area DA2 may include the second pixel circuit areas PCA2. The second pixel circuit area PCA2 may be an area where any one of the second pixel circuits PC2 and the third pixel circuits PC3 may be arranged. Thus, the first portion DA2-1 and the second portion DA2-2 of the second display area DA2 may include the second pixel circuit PC2, the second display element DE2 connected thereto, and the third pixel circuit PC3.

In such an embodiment, the first portion DA3-1 and the second portion DA3-2 of the third display area DA3 may include the driver circuit areas DCA. The driver circuit area DCA may be an area where any one of the first driver circuits DC1 and the second driver circuits DC2 may be arranged. The third display area DA3 may include the first driver circuit DC1 and the second driver circuit DC2, the first portion DA3-1 of the third display area DA3 may only include the first driver circuit DC1, and the second portion DA3-2 of the third display area DA3 may only include the second driver circuit DC2. That is, the first portion DA3-1 of the third display area DA3 may include the first driver circuit DC1 and the third display element DE3, and the second portion DA3-2 of the third display area DA3 may include the second driver circuit DC2 and the third display element DE3. In an embodiment, the first driver circuit DC1 may be a scan driver circuit, and the second driver circuit DC2 may be an emission driver circuit.

In the display apparatus according to an embodiment, an area of the dead space where no pixels are arranged may be substantially reduced. In an embodiment of the display panel 10, as shown in FIG. 7, the first driver circuit DC1 and the second driver circuit DC2 may be arranged inside the display area DA, and as the third display element DE3 is arranged to overlap at least one driver circuit DC, a driver circuit portion, power supply lines, etc. may be disposed under the display element DE. Accordingly, a dead space conventionally occupied by the driver circuit portion or the power supply lines may be effectively reduced.

In such an embodiment, as shown in FIG. 7, the planar area of the first pixel circuit areas PCA1 located in the first display area DA1 may be greater than the planar area of the second pixel circuit areas PCA2 located in the second display area DA2 and the planar area of the driver circuit areas DCA located in the third display area DA3. That is, the pixel circuits PC and the driver circuits DC may be arranged at a higher density in the second display area DA2 and the third display area DA3 than in the first display area DA1. Because the third pixel circuit PC3 may not be arranged under the third display element DE3, which is arranged in the third display area DA3, to overlap the same as the driver circuit DC is arranged in the third display area DA3, it is desired to arrange the third pixel circuits PC3 in an adjacent second display area DA2.

In the display apparatus according to an embodiment, the third display area DA3 may be divided into the first portion DA3-1 and the second portion DA3-2 of the third display area DA3, and as the driver circuits DC are distributed and arranged in the first portion DA3-1 and the second portion DA3-2, an area of the second display area DA2 may be reduced. The second display area DA2 may be an area where the second pixel circuit PC2 as well as the third pixel circuit PC3 connected to the third display element DE3 arranged in the third display area DA3 are included. In the second display area DA2, the second connection line CL2 connecting the second display element DE2 and the second pixel circuit PC2 and the third connection line CL3 connecting the third display element DE3 to the third pixel circuit PC3 have greater lengths than the first connection line CL1. Also, because the second display area DA2 includes a narrow second pixel circuit area PCA2 where each second pixel circuit PC2 and each third pixel circuit Pc3 are arranged, the arrangements of signal lines may be complex, and a spatial margin may lack while lines are designed.

In such an embodiment, where the third display area DA3, where the driver circuits DC are arranged, is divided into the first portion DA3-1 and the second portion DA3-2, the number of third pixel circuits PC3 respectively arranged in the first portion DA2-1 and the second portion DA2-2 of the second display area DA2 may decrease. Thus, because a portion of the second display element DE2 overlaps the third pixel circuit PC3 and the second pixel circuit PC2 connected to the second display element DE2 through the second connection line CL2 has a relatively small area, areas of the first portion DA2-1 and the second portion DA2-2 of the second display area DA2 may be reduced. As a result, although the driver circuits DC are arranged in the display area DA, the arrangements of the signal lines may become less complex as the area of the second display area DA2 is reduced, and a spatial margin for line design may be sufficiently secured.

Also, in a display apparatus according to an embodiment, the display area DA may include the trenches TR defined or formed along boundaries of the first pixel circuit areas PCA1, the second pixel circuit areas PCA2, and the driver circuit areas DCA. The trenches TR may include the first trenches TR1 formed in the first portion DA1-1 and the second portion DA1-2 of the first display area, the second trenches TR2 formed in the first portion DA2-1 and the second portion DA2-2 of the second display area, and the third trenches TR3 formed in the first portion DA3-1 and the second portion DA3-2 of the third display area.

Referring to FIG. 8, the first driver circuit DC1 and the second driver circuit DC2 may be arranged in the first portion DA3-1 and the second portion DA3-2 of the third display area DA3, respectively. In such an embodiment, where the third display area DA3 is divided and arranged, the third trenches TR3 may be formed in the first insulating layer IL1 to correspond to the boundary of the driver circuit area DCA where the driver circuits DC are arranged. In addition, the second insulating layer IL2 is formed to be buried or filled in the trenches TR, such that the step difference in the first insulating layer IL1, which may occur because of the first trenches TR1 to the third trenches TR3, may be removed or reduced.

Accordingly, in a display apparatus according to an embodiment, the propagation of the cracks that may occur in the first insulating layer IL1 of a pixel due to external impact into adjacent pixels may be effectively prevented or reduced. In a display apparatus according to an embodiment, the trenches TR may be formed in a boundary area where the driver circuits DC are separately arranged. Accordingly, when cracks, etc. occur in an area where the pixel circuit PC is arranged as well as an area where the driver circuit DC is arranged, the third trenches TR3 may reduce the growth of cracks or damage. That is, in the display apparatus according to an embodiment, the driver circuits DC are arranged in the display area DA, and thus, the display apparatus may include a reduced dead space and may be robust to external impact.

As described above, according to one or more embodiments of the invention, a high-resolution display apparatus, which includes a reduced non-display area, that is, a dead space and is robust and flexible to the external impact, may be realized.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display apparatus comprising:

a substrate in which a first display area, a second display area located on an outer side of the first display area, a third display area located on an outer side of the second display area, and a non-display area are defined;

a plurality of first pixel circuits located in the first display area and arranged in a first direction;

a plurality of second pixel circuits and a plurality of third pixel circuits which are located in the second display area and arranged in the first direction;

a plurality of driver circuits located in the third display area and arranged in the first direction;

an inorganic insulating layer provided with a plurality of trenches defined along a boundary between two adjacent driver circuits among the plurality of driver circuits; and an organic insulating layer disposed on the inorganic insulating layer and covering the plurality of first pixel circuits, the plurality of second pixel circuits and the plurality of driver circuits, wherein at least a portion of the organic insulating layer is filled in the plurality of trenches.

2. The display apparatus of claim 1, further comprising:

a plurality of first display elements located in the first display area and electrically connected to the plurality of first pixel circuits;

a plurality of second display elements located in the second display area and electrically connected to the plurality of second pixel circuits; and a plurality of third display elements located in the third display area and electrically connected to the plurality of third pixel circuits, wherein the plurality of first display elements, the plurality of second display elements, and the plurality of third display elements each comprise a first electrode, an emission layer, and a second electrode.

3. The display apparatus of claim 2, wherein the inorganic insulating layer is further provided with a plurality of trenches defined along a boundary between two adjacent pixel circuits among the plurality of first pixel circuits, the plurality of second pixel circuits, and the plurality of third pixel circuits.

4. The display apparatus of claim 3, wherein a first trench distance between two adjacent trenches, which are adjacent to each other in the first direction, in the first display area is greater than a second trench distance between two adjacent trenches, which are adjacent to each other in the first direction, in the second display area and a third trench distance between two adjacent trenches, which are adjacent to each other in the first direction, in the third display area.

5. The display apparatus of claim 3, wherein the plurality of first pixel circuits, the plurality of second pixel circuits, the plurality of third pixel circuits, and the plurality of driver circuits, which are arranged adjacent to each other, share signal lines, and the plurality of trenches exposes a portion of the signal lines, and the organic insulating layer contacts the portion of the signal lines.

6. The display apparatus of claim 5, wherein a signal line disposed under the plurality of trenches extends continuously across the plurality of trenches.

7. The display apparatus of claim 2, further comprising:

a plurality of first connection lines connecting the plurality of first display elements to the plurality of first pixel circuits;

a plurality of second connection lines connecting the plurality of second display elements to the plurality of second pixel circuits; and a plurality of third connection lines connecting the plurality of third display elements to the plurality of third pixel circuits.

8. The display apparatus of claim 7, wherein a length of each of the plurality of second connection lines and a length of each of the plurality of third connection lines are greater than or equal to a length of each of the plurality of first connection lines.

9. The display apparatus of claim 7, wherein the plurality of first connection lines, the plurality of second connection lines, and the plurality of third connection lines each comprise a material different from a material in the first electrode.

10. The display apparatus of claim 2, wherein a first display element distance between two adjacent first display elements, which are adjacent to each other in the first direction, in the first display area, a second display element distance between two adjacent second display elements, which are adjacent to each other in the first direction, in the second display area, and a third display element distance between two adjacent third display elements, which are adjacent to each other in the first direction, in the third display area are substantially the same as each other.

11. The display apparatus of claim 2, further comprising:

a shielding layer arranged between the plurality of driver circuits and the plurality of third display elements.

12. The display apparatus of claim 1, wherein the plurality of driver circuits comprise a plurality of first driver circuits and a plurality of second driver circuits, and the plurality of first driver circuits are scan driver circuits, and the plurality of second driver circuits are emission driver circuits.

13. The display apparatus of claim 12, wherein the plurality of first driver circuits and the plurality of second driver circuits are arranged adjacent to each other in the first direction, and the plurality of second driver circuits are arranged more outwardly than the plurality of first driver circuits, and the plurality of first driver circuits and the plurality of second driver circuits are respectively arranged in a second direction crossing the first direction.

14. The display apparatus of claim 12, wherein the plurality of first driver circuits and the plurality of second driver circuits are separately arranged in the first direction, the plurality of first driver circuits and the plurality of second driver circuits are respectively arranged in a second direction crossing the first direction, and a portion of the plurality of first pixel circuits, a portion the plurality of second pixel circuits, and a portion the plurality of third pixel circuits are arranged between the plurality of first driver circuits and the plurality of second driver circuits.

15. A display apparatus comprising:

a substrate in which a display area and a non-display area surrounding the display area are defined;

a plurality of pixel circuits arranged in the display area;

a plurality of first driver circuits and a plurality of second driver circuits arranged in the display area;

a plurality of display elements arranged in the display area and overlapping at least one selected from the plurality of pixel circuits, the plurality of first driver circuits, and the plurality of second driver circuits;

a first insulating layer provided with a plurality of grooves defined along a boundary between the plurality of pixel circuits, the plurality of first driver circuits, and the plurality of second driver circuits; and a plurality of organic insulating layers disposed on the first insulating layer and covering the plurality of pixel circuits, the plurality of first driver circuits and the plurality of second driver circuits, wherein at least one selected from the plurality of organic insulating layers is disposed in the plurality of grooves, and the plurality of organic insulating layers comprises a material different from a material in the first insulating layer.

16. The display apparatus of claim 15, wherein the display area comprises a first display area, a second display area, and a third display area, the plurality of pixel circuits comprise a plurality of first pixel circuits arranged in the first display area, a plurality of second pixel circuits arranged in the second display area, and a plurality of third pixel circuits arranged in the second display area, the plurality of first driver circuits and the plurality of second driver circuits are arranged in the third display area, and a plurality of display elements overlapping at least one selected from the plurality of first driver circuits and the plurality of second driver circuits are electrically connected to the plurality of third pixel circuits.

17. The display apparatus of claim 16, wherein a planar area of a first pixel circuit area, which is an area occupied by each of the plurality of first pixel circuits, is greater than a planar area of a second pixel circuit area, which is an area occupied by each of the plurality of second pixel circuits, and a planar area of a third pixel circuit area, which is an area occupied by each of the plurality of third pixel circuits.

18. The display apparatus of claim 16, wherein the plurality of display elements are evenly arranged in the first display area, the second display area, and the third display area.

19. The display apparatus of claim 15, further comprising:

a plurality of connection lines for electrically connecting the plurality of pixel circuits, the plurality of first driver circuits, the plurality of second driver circuits, and the plurality of display elements, wherein each of the plurality of display elements comprises a first electrode, an emission layer, and a second electrode, and the plurality of connection lines comprises a material different from a material in the first electrode.

20. The display apparatus of claim 15, wherein the plurality of first driver circuits are scan driver circuits, the plurality of second driver circuits are emission driver circuits, and the plurality of second driver circuits are arranged more outwardly than the plurality of first driver circuits.

* * * * *